(12) United States Patent
Masuda

(10) Patent No.: US 6,825,128 B2
(45) Date of Patent: Nov. 30, 2004

(54) METHOD FOR MANUFACTURING SEMICONDUCTOR DEVICE

(75) Inventor: Shuichi Masuda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/460,269

(22) Filed: Jun. 13, 2003

(65) Prior Publication Data

US 2003/0232503 A1 Dec. 18, 2003

(30) Foreign Application Priority Data

Jun. 14, 2002 (JP) ........................................ 2002-174094

(51) Int. Cl.[7] .............................................. H01L 21/302
(52) U.S. Cl. ..................... 438/750; 438/424; 438/425; 438/435; 438/700; 438/704
(58) Field of Search ................................ 438/424, 425, 438/435, 700, 704, 750

(56) References Cited

U.S. PATENT DOCUMENTS 6,074,931 A * 6/2000 Chang et al. ............... 438/424
6,284,623 B1 * 9/2001 Zhang et al. ............... 438/424
6,541,382 B1 * 4/2003 Cheng et al. ............... 438/692
2002/0003275 A1 * 1/2002 Lee et al. ................... 257/510

FOREIGN PATENT DOCUMENTS

JP          2000-323565 A    11/2000
TW              412841      * 11/2000

* cited by examiner

Primary Examiner—George A. Goudreau
(74) Attorney, Agent, or Firm—Foley & Lardner LLP

(57) ABSTRACT

A provided method for manufacturing the semiconductor device includes the steps of: forming a trench in a silicon substrate on which a silicon oxide film and a silicon nitride film are sequentially stacked; oxidizing the silicon substrate by an oxidation method of not forming nearly at all a silicon oxide film on a surface of the silicon nitride film, to form a silicon oxide film on the surface of the trench and perform pullback etching on the silicon nitride film; and performing rounding oxidation by using radical oxidation to round an edge of the surface of the trench. Therefore, it is possible to perform pullback etching on the nitride film, even in case of performing rounding oxidation by using radical oxidation.

9 Claims, 12 Drawing Sheets

6;opening

7;silicon oxide film

10; element isolation region

FIG.9A *(PRIOR ART)*
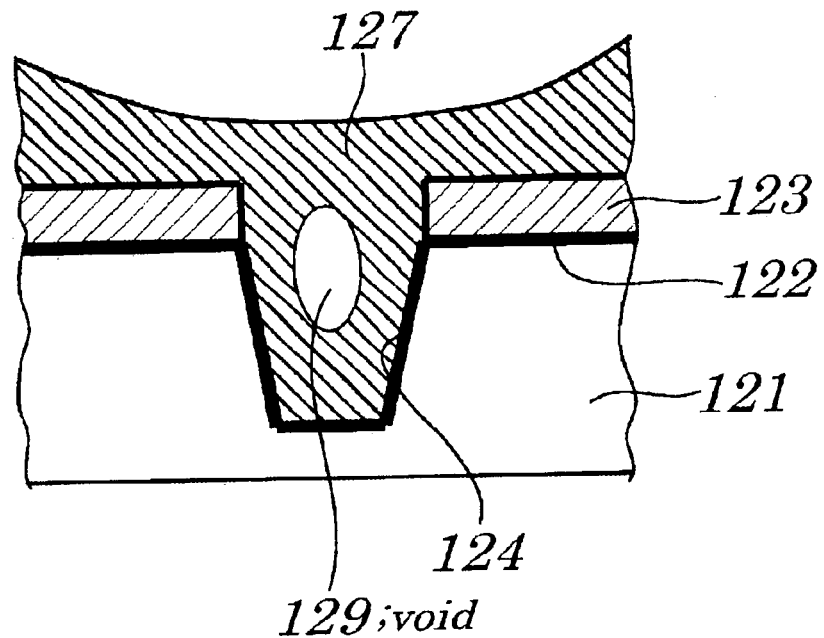
FIG.9B *(PRIOR ART)*
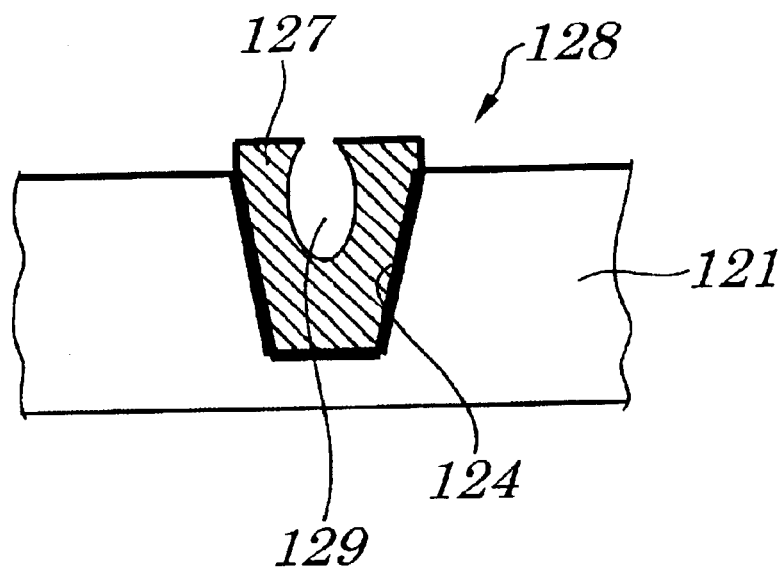

US 6,825,128 B2

METHOD FOR MANUFACTURING SEMICONDUCTOR DEVICE

BACKGROUND OF THE INVENTION

1. Field of the Invention

The present invention relates to a method for manufacturing a semiconductor device and, more particularly, to the method for manufacturing the semiconductor device by which an element isolation region is formed utilizing an STI (Shallow Trench Isolation) method.

The present application claims priority of Japanese Patent Application No. 2002-174094 filed on Jun. 14, 2002, which is hereby incorporated by reference.

2. Description of the Related Art

Large Scale Integrations (LSIs) known as a representative of semiconductor devices are roughly classified into memory devices and logic devices, most of which are made up of Metal Oxide Semiconductor (MOS) type transistors are excellent in integration density. By thus manufacturing the LSI using the MOS type transistor as a component unit, an advantage in improvements of the integration density can be utilized greatly, thereby reducing costs of the LSI.

When manufacturing the LSI, in order to insulate and isolate semiconductor regions (active regions) from each other in each of which elements (the MOS type transistors) are to be formed, an element isolation region is formed on a semiconductor substrate beforehand. To form such the element isolation region, conventionally a method of Local Oxidation of Silicon (LOCOS) has been used commonly. The element isolation region formed by this LOCOS method, however, occupies a relatively large area inevitably due to its nature in methodology to thus degrade the integration density; therefore, an STI method is employed in place of the LOCOS method recently. The STI method has a feature that the element isolation region is formed by forming a trench in the semiconductor substrate beforehand and then burying an oxide (insulating material) into the trench. By the STI method, the oxide is buried into a minute trench which is formed in a semiconductor substrate by utilizing a known photolithographic process, so that the element isolation region having a small area can be realized, thereby avoiding a decrease in the integration density.

Typically, however, if the element isolation region is formed by the STI method, as shown in FIG. 7, a periphery of an oxide 135 buried into a trench 132 in a semiconductor substrate 131 is etched off to thus form a hollow (depression) 133. The hollow 133 may generate a sub-channel when subsequently a MOS type transistor, which is an element, is formed in an active region 134, thereby giving rise to a irregular leakage current when the MOS type transistor is in an OFF state.

A semiconductor device manufacturing method for avoiding occurrence of such a hollow as described above when forming an element isolation region by thus utilizing the STI method is disclosed, for example, in Japanese Patent Application Laid-open No. 2000-323565. The semiconductor device manufacturing method (first conventional method) is described in sequence of processes with reference to FIGS. 4A to 4G.

First, as shown in FIG. 4A, on a silicon substrate 101, an oxide film 102 (undercoating film) made of a silicon oxide and a silicon nitride film 103 are formed and stacked sequentially. Next, as shown in FIG. 4B, after the silicon nitride film 103 and the oxide film (undercoating film) 102 in an element isolation region formation-expected region are selectively etched off by anisotropic etching, the silicon substrate 101 is selectively etched off using the silicon nitride film 103 as a mask, to form a trench 104.

Next, as shown in FIG. 4C, the silicon nitride film 103 undergoes a pullback (backing-off) type of isotropic etching (hereinafter referred to as pullback etching) using hot phosphoric acid, to form therein an opening 105 having a width W1 larger than a width W2 of an opening of the trench 104. Next, as shown in FIG. 4D, a buried oxide film 106 made of a silicon oxide film is formed over (on) all of the silicon substrate 101, the oxide film 102, the silicon nitride film 103 and the trench 104 by Chemical Vapor Deposition (CVD) method.

Next, as shown in FIG. 4E, the buried silicon oxide film 106 is polished so as to be thinner by Chemical Mechanical Polishing (CMP) using the silicon nitride film 103 as a stopper layer. Next, as shown in FIG. 4F, the silicon nitride film 103 is etched off using hot phosphoric acid. As a result, the buried silicon oxide film 106, which is already present in the opening 105 formed in the silicon nitride film 103 by pullback etching as shown in the step of FIG. 4C, is left as partially spreading over the oxide film (undercoating film) 102, so that such a hollow as described above is not formed. Further, by forming the opening 105 by pullback etching, it is possible to improve a degree of the oxide buried film 106 being buried into the trench 104. In this case, processing is performed so that a width "a" and a height "b" of the spread may be larger than a film thickness of the oxide film 102. Next, as shown in FIG. 4G, the oxide film 102 is selectively etched off by wet etching using hydrofluoric acid, to form an element isolation region 108.

In a case where the element isolation region 108 is formed by the first conventional technology described above, although it is possible to avoid such formation of the hollow as described above, a surface of the trench 104 in the silicon substrate 101 is exposed when the silicon nitride film 103 is pullback-etched in a step of FIG. 4C and so roughly etched, which is a disadvantage.

To eliminate this disadvantage, such a semiconductor device manufacturing method is provided that in a case of forming an element isolation region by utilizing an STI method, a trench surface is protected by an insulation film when a silicon nitride film undergoes pullback etching. The following will describe the semiconductor device manufacturing method (second conventional method) in sequence of processes with reference to FIGS. 5A–5H.

First, as shown in FIG. 5A, on a silicon substrate 111, a silicon oxide film 112 and a silicon nitride film 113 are formed and stacked sequentially beforehand. Then, the silicon nitride film 113 and the silicon oxide film 112 which are present on an element isolation region formation-expected region (not labeled or shown) are selectively etched off. And then, the silicon substrate 111 is selectively etched off by plasma etching method using the silicon nitride film 113 as a mask to thus form therein a trench 114 having a depth of about 300 nm. Next, as shown in FIG. 5B, by heating the silicon substrate 111 to about 950° C. by wet oxidation to perform rounding oxidation in order to round an edge of the trench 114 in the silicon substrate 111, a silicon oxide film 115 having a film thickness of about 20 nm is formed on a surface of the trench 114. This silicon oxide film 115 undertakes a role of covering the surface of the trench 114 to protect it when the silicon nitride film 113 undergoes pullback etching subsequently. It is to be noted that during the rounding oxidation, a surface of the silicon nitride film 113 is also oxidized slightly simultaneously to thus have a thin silicon oxide film 116 formed thereon. In this case, a ratio in film thickness between the silicon oxide film 115 and the thin silicon oxide film 116 is about 20–25:1.

Next, as shown in FIG. 5C, by performing wet etching using an etchant containing hydrofluoric acid for about one minute, the thin silicon oxide film 116 on the surface of the silicon nitride film 113 is etched off as pre-pullback processing. This etching of the thin silicon oxide film 116 is performed in order to stabilize the subsequent pullback etching of the silicon nitride film 113 by use of hot phosphoric acid. That is, since a selective ratio between the silicon nitride film 113 and the silicon oxide film 112 is high, the thin silicon oxide film 116, if any on the surface of the silicon nitride film 113, blocks etching of the silicon nitride film 113, so that at the time of pullback etching, an etching rate of the silicon nitride film 113 fluctuates and is destabilized.

If the etching rate of the silicon nitride film 113 thus fluctuates, the following element formation process gives rise to undesirable symptoms such as a field over-hung at the time of an ion injection, an STI step, and an irregular hollow shape.

Next, as shown in FIG. 5D, the silicon nitride film 113 undergoes a pullback type of isotropic etching using hot phosphoric acid, to form therein an opening 117 having a width W1 larger than a width W2 of the trench 114. During this etching process, the silicon oxide films 112 and 115 are also etched slightly simultaneously. Next, as shown in FIG. 5E, a buried silicon oxide film 118 made of a silicon oxide film is formed over (on) the silicon substrate 111, the silicon oxide film 112, the silicon nitride film 113 and the trench 114 by the CVD method. Next, as shown in FIG. 5F, the buried silicon oxide film 118 is polished by CMP so as to be thinner using the silicon nitride film 113 as a stopper layer. Next, as shown in FIG. 5G, the silicon nitride film 113 is etched off using hot phosphoric acid. Next, as shown in FIG. 5H, the silicon oxide film 112 is selectively etched off to thus form an element isolation region 119.

In the case of forming the element isolation region 119 by the second conventional technology described above, however, rounding oxidation by use of wet oxidation in a step of FIG. 5B gives rise to a disadvantage that the edge of the trench 114 cannot well be rounded. That is, as shown in FIG. 8, the silicon oxide film 115 formed by the rounding oxidation overhangs at the edge of the trench 114, thereby fluctuating in film thickness. Such a poorly formed round shape may produce a sub-channel as described above, thereby generating a leakage current when a relevant transistor is OFF or fluctuating a threshold value thereof. Thus, it is considered that the rounded shape cannot be well formed in rounding oxidation because the edge is rounded utilizing wet oxidation.

To form an element isolation region by a STI method, on the other hand, there has been provided such a semiconductor device manufacturing method that a well-rounded shape can be obtained by performing a rounding oxidation by use of radical oxidation. Radical oxidation refers to such oxidation as to use as a reacting species a molecule or an atom (radical) which is in an excitation state having a chemically high degree of activity and so has a high degree of oxidation behavior. The following will describe this semiconductor device manufacturing method (third conventional technology) in sequence of processes with reference to FIGS. 6A–6F.

First, as shown in FIG. 6A, on a silicon substrate 121, a silicon oxide film 122 and a silicon nitride film 123 are formed and stacked sequentially beforehand. Then, the silicon nitride film 123 and the silicon oxide film 122 in an element isolation region formation-expected region (not labeled or shown) are selectively etched off. And then, the silicon substrate 121 is selectively etched by plasma etching method using the silicon nitride film 123 as a mask to thus form therein a trench 124 having a depth of about 300 nm. Next, as shown in FIG. 6B, by performing radical oxidation to round an edge of the trench 124 in the silicon substrate 121, a silicon oxide film 125 having a film thickness of about 20 nm is formed on a surface of the trench 124. By using radical oxidation in such a manner, a rounded shape can be improved. Since radical oxidation has a high degree of oxidation behavior as described above, a surface of the silicon nitride film 123 is also oxidized considerably during this oxidation, to thereby form a silicon oxide film 126. In this case, a ratio in film thickness between the silicon oxide film 125 and the silicon oxide film 126 is about 1.5–2.0:1.

If, however, the silicon oxide film 126 on the surface of the silicon nitride film 123 is etched off beforehand in order to perform pullback etching subsequently, the silicon oxide film 125 on the surface of the trench 124 may also be etched off simultaneously during this etching process. That is, as described above, if radical oxidation is used as rounding oxidation, due to the high degree of oxidation behavior the silicon oxide films 125 and 126 having only a slight difference in film thickness (with a film thickness ratio of 1.5–2.0:1 as one example described above) are formed on the surfaces of the trench 124 and the silicon nitride film 123 respectively, so that the silicon oxide film 125 on the surface of the trench 124 may also be etched off if the silicon oxide film 126 on the surface of the silicon nitride film 123 is etched off. The surface of the trench 124, therefore, may be exposed incidentally, so that it is impossible to perform pre-pullback processing to etch off the silicon oxide film 126 on the surface of the silicon nitride film 123. As a result, by the third conventional technology, the silicon oxide film 126 is left non-removed on the surface of the silicon nitride film 123, so that it is impossible to perform pullback etching.

Next, as shown in FIG. 6C, a buried silicon oxide film 127 made of a silicon oxide film is formed throughout a surface of the substrate by CVD. Next, as shown in FIG. 6D, the buried silicon oxide film 127 is polished by CMP so as to be thinner using the silicon nitride film 123 as a stopper layer. Next, as shown in FIG. 6E, the silicon nitride film 123 is etched off using hot phosphoric acid. Next, as shown in FIG. 6F, the silicon oxide film 122 is selectively etched off to thus form an element isolation region 128.

This conventional semiconductor device manufacturing method (third conventional technology) for performing rounding oxidation employing radical oxidation cannot perform pullback etching of the silicon nitride film in order to form a large opening by pullback etching and so has a problem that if a an element isolation region having a small width is formed, the silicon oxide film is buried insufficiently.

That is, although by the third conventional technology, in a step of FIG. 6B, a rounded shape can be improved by rounding oxidation by use of radical oxidation, the silicon oxide film 126 is also formed simultaneously on the surface of the silicon nitride film 123 during the rounding oxidation because radical oxidation has a high degree of oxidation behavior. If, then, this silicon oxide film 126 is etched off by pullback etching, the silicon oxide film 125 present on the surface of the trench 124 is also etched off simultaneously during the etching, so that the silicon substrate 121 is partially exposed and roughened in surface condition, thereby making it impossible to etch off the silicon oxide film 126. As a result, pullback etching cannot be performed.

Further, by the third conventional technology, since the silicon nitride film 123 does not undergo pullback etching and so has no large opening formed therein, if the element isolation region 128 having a small width is formed, as shown in FIG. 9A, the silicon oxide film 127 cannot fully be buried into the trench 124 formed thin, to thus generate a void 129 inside the silicon oxide film 127, thereby resulting in the silicon oxide film 127 being incompletely buried. When subsequently an element (not shown) is formed and a gate wiring line (not shown) is formed as spreading over the element isolation region 128, as shown in FIG. 9B, this void 129 becomes an exposed vacancy, into which the gate wiring line may be buried and left there unnecessarily, thereby contributing to, for example, short-circuiting between the gate wiring lines.

SUMMARY OF THE INVENTION

In view of the above, it is an object of the present invention to provide a method for manufacturing a semiconductor device that can perform pullback etching on a silicon nitride film even when rounding oxidation is performed using radical oxidation.

According to a first aspect of the present invention, there is provided a semiconductor device manufacturing method including, burying an insulating material into a trench formed in a semiconductor substrate to thereby form an element isolation region in order to form a desired element in each of semiconductor regions which are insulated and isolated from each other by the element isolation region, the method including:

a trench formation step for sequentially forming and stacking an oxide film and a nitride film on the semiconductor substrate, to selectively etch off the nitride film and the oxide film which are present on a region in which the element isolation region is expected to be formed and then selectively etch off the semiconductor substrate using the nitride film as a mask, thus forming the trench;

a semiconductor substrate oxidation step for oxidizing the semiconductor substrate by a method of forming an oxide film only on a surface of the trench without forming nearly at all an oxide film on a surface of the nitride film;

a nitride film pullback step for performing pullback etching on the nitride film in such a manner that a width of an opening in the nitride film may be larger than a width of an opening of the trench;

a radical oxidation step for performing rounding oxidation by use of radical oxidation to thus round an edge of the surface of the trench; and an insulating material burying step for burying the insulating material into the trench.

According to a second aspect of the present invention, there is provided a semiconductor device manufacturing method including, burying an oxide into a trench formed in a silicon substrate to thereby form an element isolation region in order to form a desired element in each of semiconductor regions which are insulated and isolated from each other by the element isolation region, the method including:

a trench formation step for sequentially forming and stacking a silicon oxide film and a silicon nitride film on the silicon substrate, to selectively etch off the silicon nitride film and the silicon oxide film which are present on a region in which the element isolation region is expected to be formed and then selectively etch off the silicon substrate using the silicon nitride film as a mask, thus forming the trench;

a silicon substrate oxidation step for oxidizing the silicon substrate by a method of forming a silicon oxide film only on a surface of the trench without forming nearly at all the silicon oxide film on a surface of the silicon nitride film;

a silicon nitride film pullback step for performing pullback etching on the silicon nitride film in such a manner that a width of an opening in the silicon nitride film may be larger than a width of an opening of the trench;

a radical oxidation step for performing rounding oxidation by use of radical oxidation to thus round an edge of a surface of the trench; and an oxide burying step for burying the oxide into the trench.

In the foregoing second aspect, a preferable mode is one wherein the silicon substrate oxidation step is performed by dry oxidation at 600–750° C., to form the silicon oxide film.

Another preferable mode is one wherein the silicon oxide film is formed so as to have a film thickness of 1–4 nm.

Still another preferable mode is one wherein the dry oxidation method is performed in an oxidizing atmosphere containing an oxygen gas.

An additional preferable mode is one wherein the dry oxidation is performed in an oxidizing atmosphere in which the oxygen gas is diluted by an inert gas.

A furthermore preferable mode is one wherein the silicon substrate pullback step is performed using hot phosphoric acid.

With the above configurations, by forming the trench in the semiconductor substrate on which the oxide film and the nitride film are stacked sequentially; then forming the oxide film only on the surface of the trench; then oxidizing the semiconductor substrate by using the oxidation method without forming nearly at all the oxide film on the surface of the nitride film, to form the oxide film only on the surface of the trench and perform pullback etching on the nitride film; and then performing rounding oxidation by use of radical oxidation to round the edge of the surface of the trench, it is possible to use the pullback etching processing and the radical oxidation method in combination with each other, thereby improving a degree of the insulating material being buried and also well forming the round shape of the edge of the trench. Further, it is possible to control formation of a hollow.

Therefore, it is possible to perform pullback etching on the nitride film, even in case of performing rounding oxidation by using radical oxidation.

PRINCIPLE OF THE INVENTION

The present inventor has devoted himself to study and found that by forming an element isolation region utilizing an STI (STI (Shallow Trench Isolation)) method, it is possible to perform pullback etching on a silicon nitride film even when a rounding oxidation is performed using a radical oxidation. Conventionally, when performing the pullback etching on the silicon nitride film, it has been necessary to perform etching as pre-pullback processing in order to remove a silicon oxide film formed on a surface of the silicon nitride film during the rounding oxidation after formation of a trench. If the radical oxidation is performed in order to improve the rounding oxidation, on the other hand, due to a high degree of oxidation behavior the surface of the silicon nitride film is also oxidized heavily during the rounding oxidation to thus form a silicon oxide film, so that if this silicon oxide film is etched off for a purpose of the pullback etching, the silicon oxide film covering the surface of the trench is also etched off simultaneously, to partially expose a silicon substrate and roughen its surface inevitably. Therefore, conventionally, it has been impossible to use the pullback etching processing and the radical oxidation method in combination with each other.

However, an oxidation method, if any, to oxidize only the surface of the trench after it is formed without oxidizing nearly at all the surface of the silicon nitride film can eliminate a necessity of performing etching as pre-pullback processing, thus stabilizing pullback etching of the silicon nitride film. It in turn makes it possible to perform rounding oxidation by use of radical oxidation after pullback etching is completed, thereby utilizing them in combination with each other.

FIG. 3 shows etching characteristics A through E obtained from a silicon nitride film in a case where five types of silicon oxide films have been formed by a thermal oxidation method under later-described various oxidation conditions. In this example, a hot phosphoric acid solution (solution temperature: 140° C.) has been used as an etchant.

In FIG. 3, a characteristic A indicates an etching characteristic obtained from a silicon nitride film in a case where a silicon oxide film having about 2-nm film thickness has been formed by a dry oxidation method at a film formation temperature of about 700° C. This etching characteristic A indicates that etching of the silicon nitride film has started about 0.2 minute after a substrate was dipped into the hot phosphoric acid solution and proceeded linearly at almost the same etch rate subsequently. It is understood that during this lapse of time of about 0.2 minute, the silicon oxide film formed beforehand has been etched off. That is, the etching of the silicon nitride film has started after about 0.2 minute was spent to etch off the silicon oxide film using hot phosphoric acid.

Similarly, a characteristic B indicates an etching characteristic obtained from a silicon nitride film in a case where a silicon oxide film having about 2.5-nm film thickness has been formed by a dry oxidation method at a film formation temperature of about 750° C. This etching characteristic B indicates that etching of the silicon nitride film has started about 0.9 minute after the substrate was dipped into the hot phosphoric acid solution and proceeded linearly at almost the same etch rate subsequently. It is here understood that about 0.9 minute has been spent to etch off the silicon oxide film prior to the etching of the silicon nitride film.

Similarly, a characteristic C indicates an etching characteristic obtained from a silicon nitride film in a case where a silicon oxide film having about 3.8-nm film thickness has been formed by a dry oxidation method at a film formation temperature of about 750° C. This etching characteristic C indicates that etching of the silicon nitride film has started about two minutes after the substrate was dipped into the hot phosphoric acid solution and proceeded linearly at almost the same etch rate subsequently. It is here understood that about two minutes has been spent to etch off the silicon oxide film prior to the etching of the silicon nitride film.

Similarly, a characteristic D indicates an etching characteristic obtained from a silicon nitride film in a case where a silicon oxide film having about 3.8-nm film thickness has been formed by a dry oxidation method at a film formation temperature of about 850° C. This etching characteristic D indicates that etching of the silicon nitride film has started about 5.8 minutes after the substrate was dipped into the hot phosphoric acid solution and proceeded linearly at almost the same etch rate subsequently. It is here understood that about 5.8 minutes has been spent to etch off the silicon oxide film prior to the etching of the silicon nitride film was etched off.

Similarly, a characteristic E indicates an etching characteristic obtained from a silicon nitride film in a case where a silicon oxide film having about 3.8-nm film thickness has been formed by a wet oxidation method at a film formation temperature of 850° C. This etching characteristic E indicates that etching of the silicon nitride film has started about eight minutes after the substrate was dipped into the hot phosphoric acid solution. It is here understood that the etching characteristic E indicates that an etched amount has been constant irrespective of elapsing of time and substantially saturated immediately after the etching was started and, therefore, minimal etching was performed.

As can be seen from comparison among the five etching characteristics A–E, the time that has elapsed before starting of etching of the silicon nitride film is shortest in the case of the characteristic A, which is followed by the characteristics B, C, D, and E in this order. The etching time of about 0.2 minute for the silicon oxide film in the case of processing of the characteristic A is ⅕ or less of an etching time of about one minute for the thin silicon oxide film 116 in the case of the pre-pullback processing in the second conventional technology described with reference to FIG. 5C, so that it may be considered that although the silicon oxide film is present on the surface of the silicon nitride film, the film thickness of the silicon oxide film is of such a value as not to block the pullback etching of the silicon nitride film.

Therefore, by performing pre-pullback oxidation under oxidation conditions in accordance with the etching characteristic A, it is possible to eliminate a necessity of etching as the pre-pull back etching. In this case, it is actually difficult to measure a specific film thickness of the silicon oxide film formed on the surface of the silicon nitride film under the oxidation conditions in accordance with the etching characteristic A because this film thickness is extremely thin. Inferring from the etching characteristic A, however, as already mentioned, the film thickness is actually so extremely thin as not to block pullback etching of the silicon nitride film.

That is, the etching to be performed as the pre-pullback etching is rendered unnecessary by, as described later, performing pre-pullback oxidation in accordance with an "oxidation method of forming a silicon oxide film having a film thickness of about 2 nm by dry oxidation at a film formation temperature of about 700° C.", which provides oxidation conditions corresponding to the etching characteristic A, thereby stabilizing pullback etching of the silicon nitride film. Further, upon completion of the pullback etching, rounding oxidation by use of radical oxidation can be performed, so that it is possible to use the pullback etching proceeding and the radical oxidation method in combination with each other.

In examples of the etching characteristics B and C where the silicon oxide film has been formed by dry oxidation at about 750° C., on the other hand, the characteristic B with a thinner film thickness of about 2.5 nm has come up with a shorter time (about 0.9 minute) being spent in etching of the silicon oxide film than the characteristic C with a larger film thickness of about 3.8 nm. The etching time (about 0.9 minute) for the etching characteristic B is longer than the etching time (about 0.2 minute) of the silicon oxide film for the etching characteristic A, suggesting that etching needs to be performed as pre-pullback processing. Furthermore, the etching time (about six minutes) of the silicon oxide film for the etching characteristic D is longer than the etching time (about two minutes) of the silicon oxide film for the etching characteristic C, suggesting that etching needs to be performed as pre-pullback processing. It is to be noted that the film thickness of the silicon oxide film to be formed varies with parameters such as a gas flow rate, a film formation time, and the like even under the same temperature conditions.

It can thus be understood that even if the same film formation temperature is set in formation of a silicon oxide film by use of dry oxidation as in the cases of the etching characteristics B and C, a larger film thickness requires a longer etching time of the silicon oxide film, so that etching needs to be performed as pre-pullback processing. Further, in contrast to dry oxidation, wet oxidation makes it substantially difficult to etch off the silicon nitride film and so cannot be applied in pullback etching, as clearly indicated by the characteristic E. It is to be noted that dry oxidation is performed in an oxidizing atmosphere containing 100% oxygen.

BRIEF DESCRIPTION OF THE DRAWINGS

The above and other objects, advantages, and features of the present invention will be more apparent from the following description taken in conjunction with the accompanying drawings, in which:

FIGS. 9A–9B are illustrations for outlining a disadvantage of the conventional semiconductor device manufacturing method.

DETAILED DESCRIPTION OF THE PREFERRED EMBODIMENTS

Best mode of carrying out the present invention will be described in further detail using various embodiments with reference to the accompanying drawings based on the principle described above. The description is made specifically with reference to the embodiments.

The following will describe a semiconductor device manufacturing method according to the embodiment of the present invention with reference to FIGS. 1A–1I and FIG. 2.

Figure 1A:
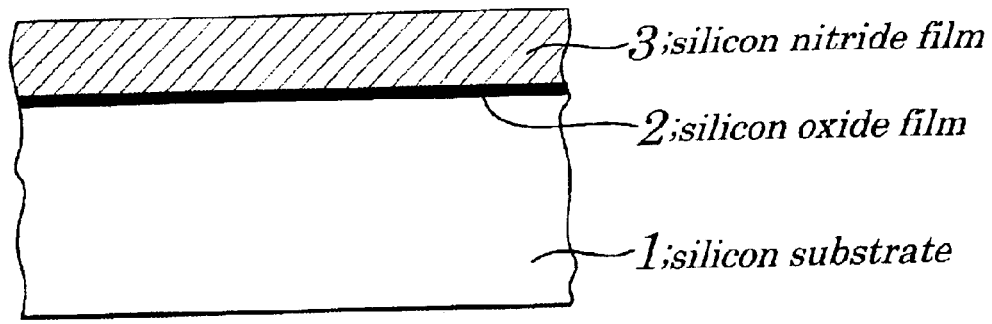
FIGS. 1A–1C are process diagrams for showing in sequence a method for manufacturing a semiconductor device according to an embodiment of the present invention.

First, as shown in FIG. 1A, a silicon oxide film 2 having a film thickness of 5–20 nm is formed by thermal oxidation on a silicon substrate 1, on which silicon oxide film 2, a silicon nitride film 3 having a film thickness of 120–140 nm is then formed by CVD (Chemical Vapor Deposition) method and stacked sequentially.

Figure 1B:
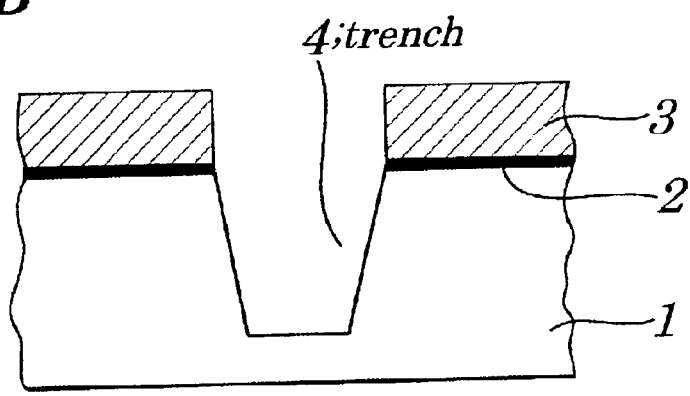

Next, as shown in FIG. 1B, after a resist film (not shown) is formed except on an element isolation forming region, allocated to form an element isolation region, on the silicon substrate 1, using the resist film (not shown) as a mask, the silicon nitride film 3 and the silicon oxide film 2 which are present on the an element isolation forming region are selectively etched off by anisotropic etching; and then, using the silicon nitride film 3 as a mask, the silicon substrate 1 is selectively etched off by plasma etching plasma to thus form a trench 4 therein having a depth of about 300 nm. It is to be noted that a width of the trench 4 is determined arbitrarily in accordance with a desired property.

Figure 1C:
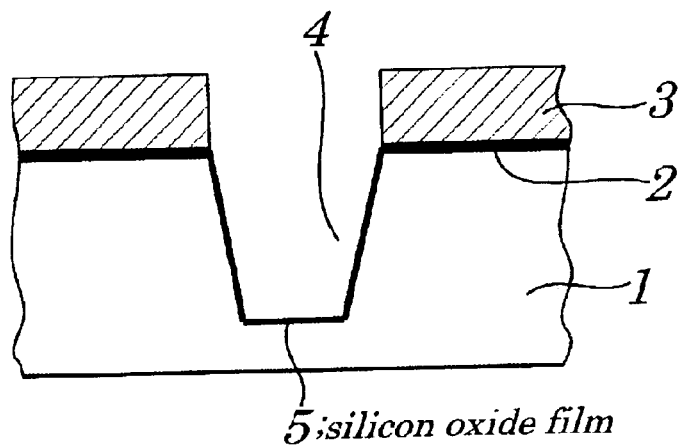

Next, as shown in FIG. 1C, by performing pre-pullback oxidation in accordance with the "oxidation method of forming a silicon oxide film having a film thickness of about 2 nm by dry oxidation at a film formation temperature of about 700° C." described in a paragraph of the principle, a silicon oxide film having a film thickness of about 2 nm is formed only on a surface of the trench 4. The dry oxidation method is performed in an oxidizing atmosphere containing 100% oxygen. In this case, as described in the paragraph of the principle, a silicon oxide film is not formed nearly at all on a surface of the silicon nitride film 3. Therefore, it is not necessary to perform etching processing as pre-pullback processing subsequently.

Figure 1D:
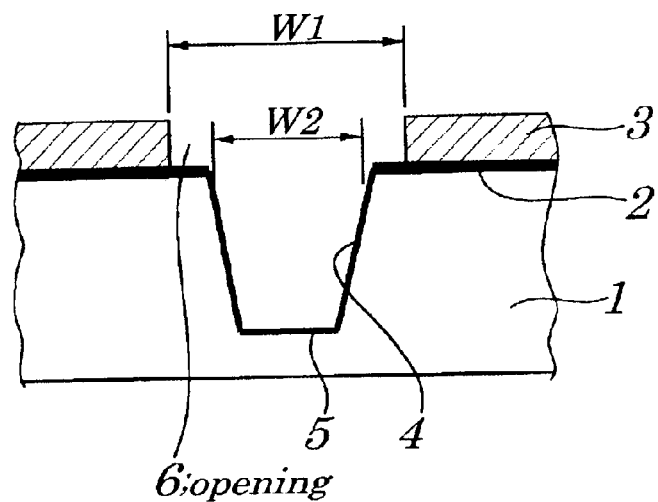
FIGS. 1D–1F are continued process diagrams for showing in sequence the method for manufacturing the same semiconductor device.

Next, as shown in FIG. 1D, using a resist film (not shown) as a mask, the silicon nitride film 3 is pullback etched by isotropic etching using hot phosphoric acid, to form therein an opening 6 having a width W1 larger than a width W2 of the trench 4 and is pulled back by about 20 nm. During this etching, the silicon oxide films 2 and 5 are also etched slightly off simultaneously.

Figure 1E:
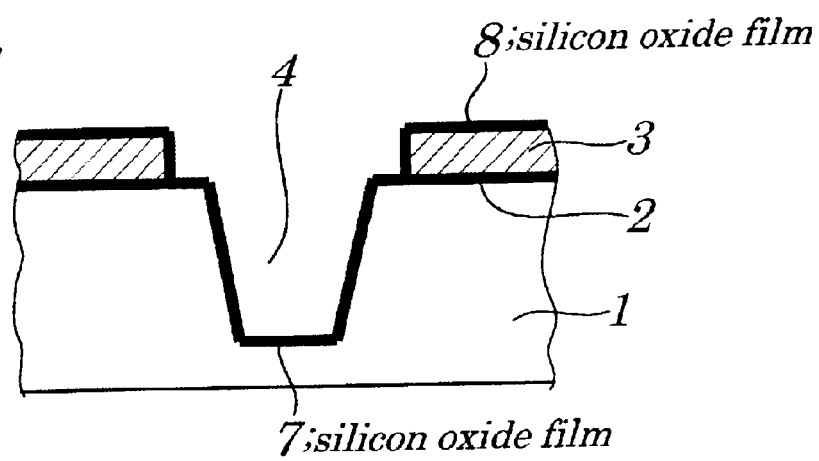
Figure 2:
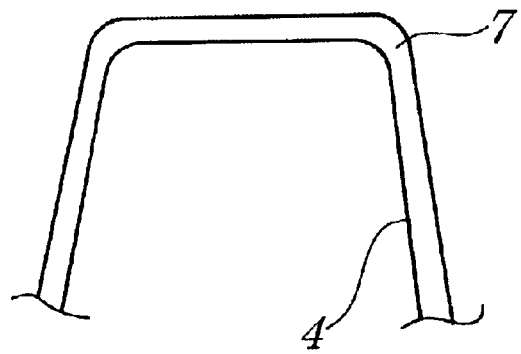
FIG. 2 is a partial diagram for showing schematically a minute part of a semiconductor device manufactured by the same method according to the same embodiment.
Figure 3:
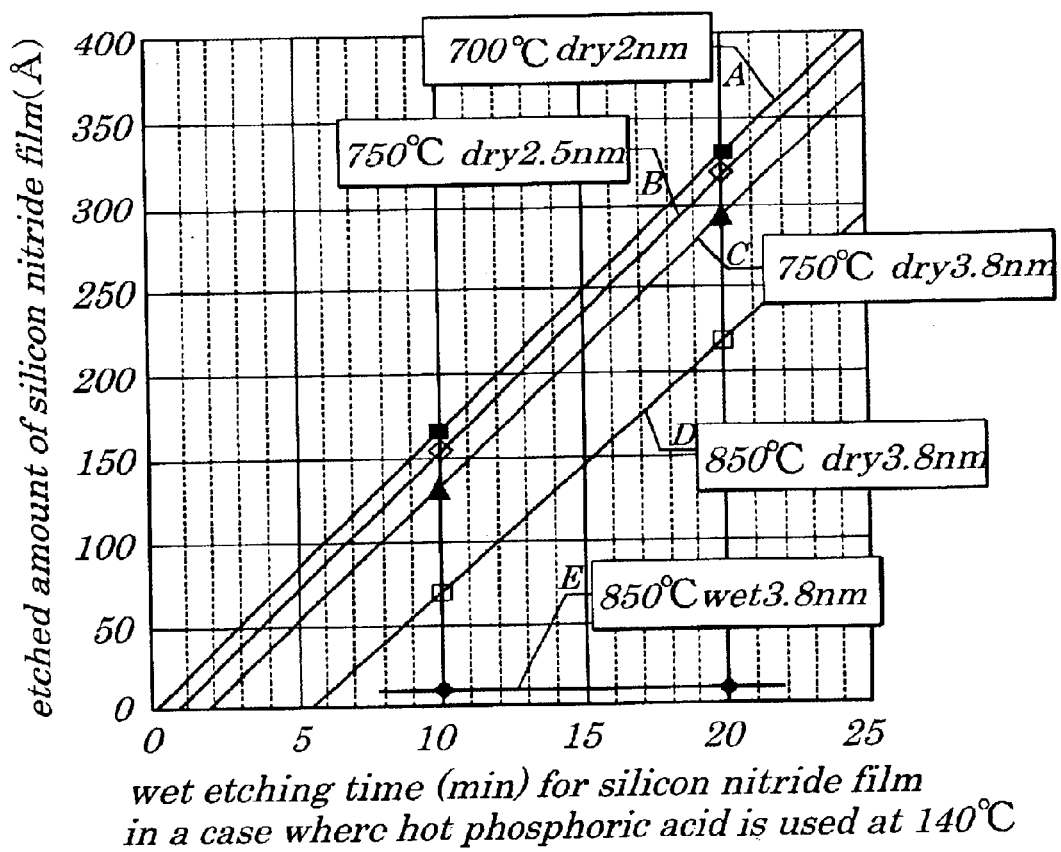
FIG. 3 is a graph for showing a relationship between an etching time (horizontal axis) of a silicon nitride film and an etched amount (vertical axis) thereof for explaining a principle of the present invention.
Figure 4A:
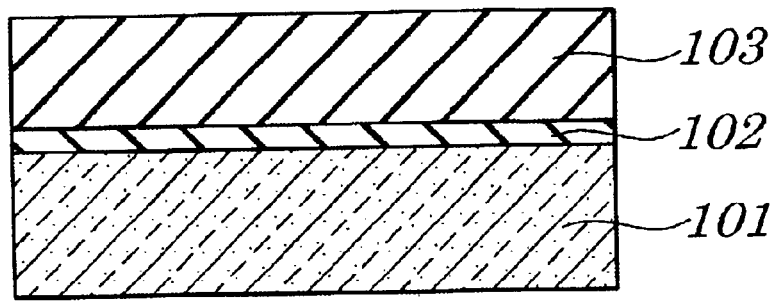
FIGS. 4A–4C are process diagrams for showing in sequence a conventional method for manufacturing a semiconductor device (a first conventional technology)
Figure 4B:
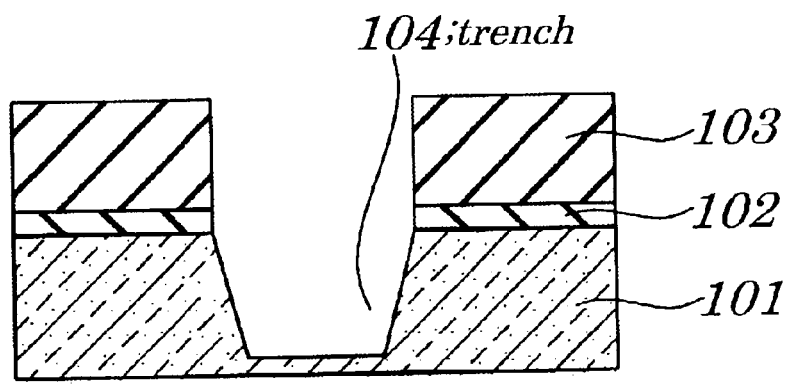
Figure 4C:
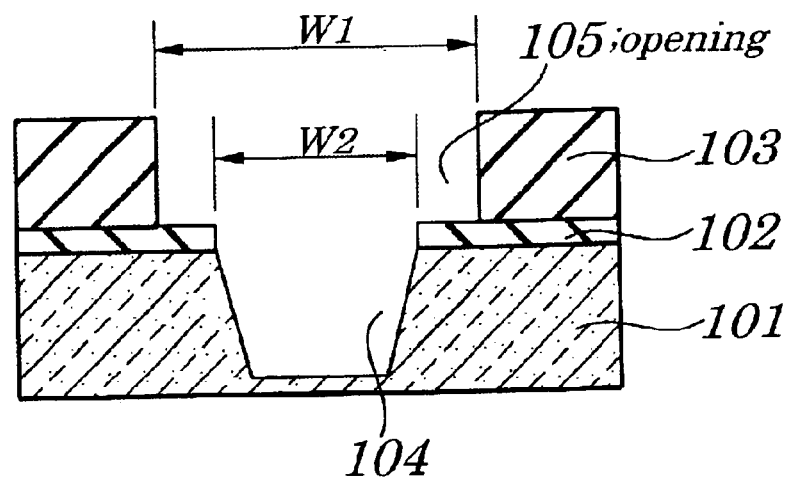
Figure 4D:
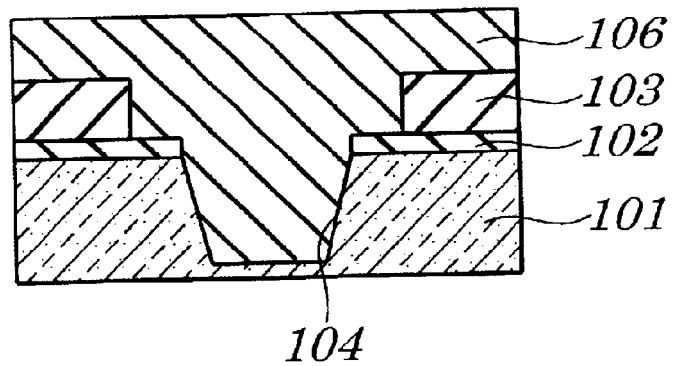
FIGS. 4D–4G are continued process diagrams for showing in sequence the conventional method for manufacturing the semiconductor device (the first conventional technology)
Figure 4E:
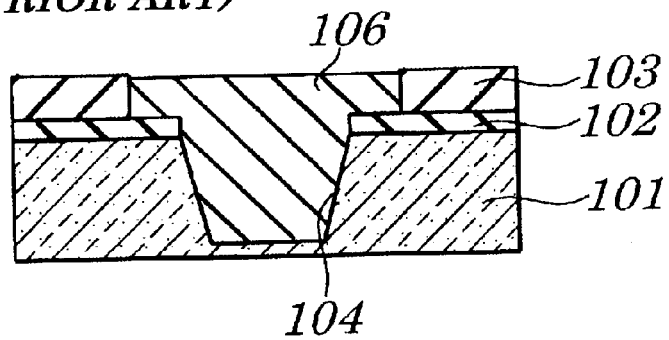
Figure 4F:
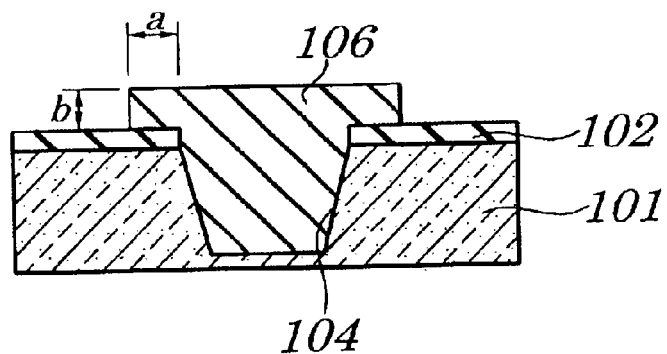
Figure 4G:
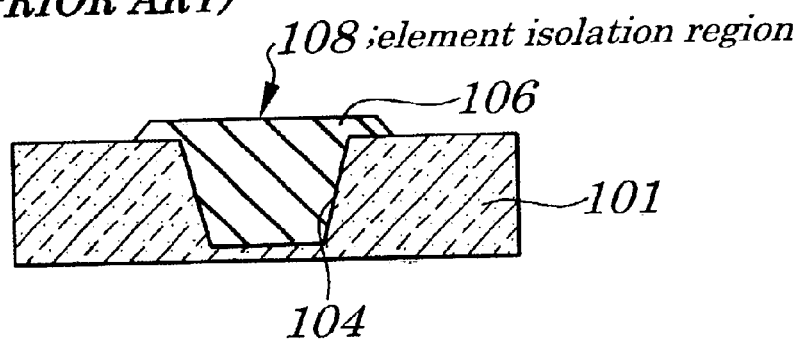
Figure 5A:
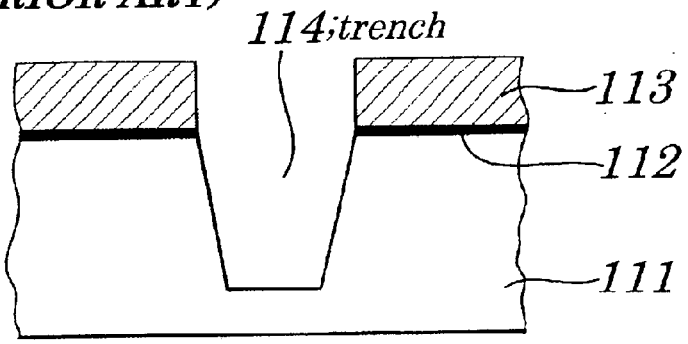
FIGS. 5A–5D are process diagrams for showing in sequence another conventional method for manufacturing a semiconductor device (a second conventional technology)
Figure 5B:
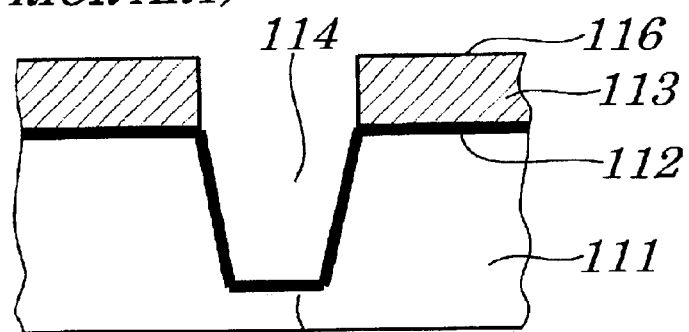
Figure 5C:
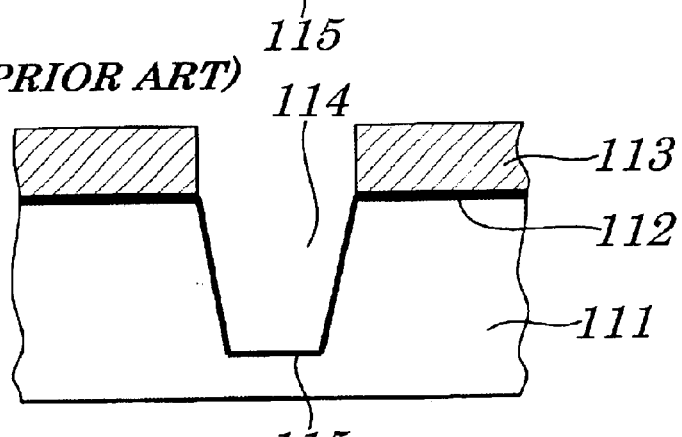
Figure 5D:
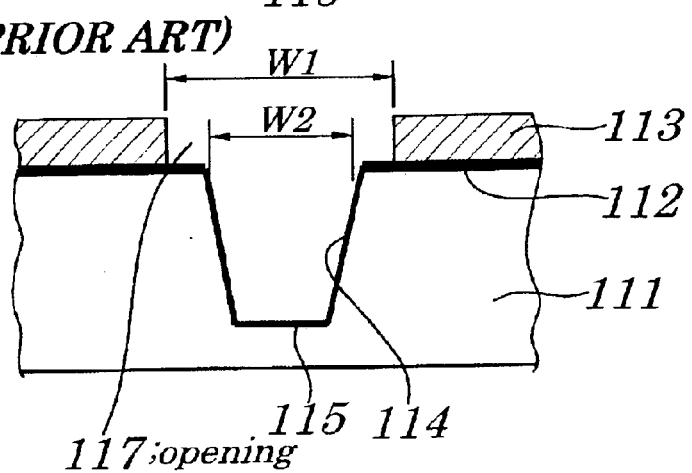
Figure 5E:
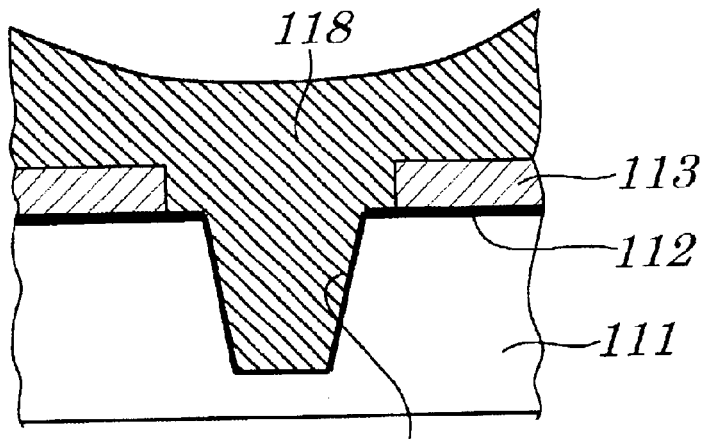
FIGS. 5E–5H are continued process diagrams for showing in sequence the other conventional method for manufacturing the semiconductor device (the second conventional technology)
Figure 5F:
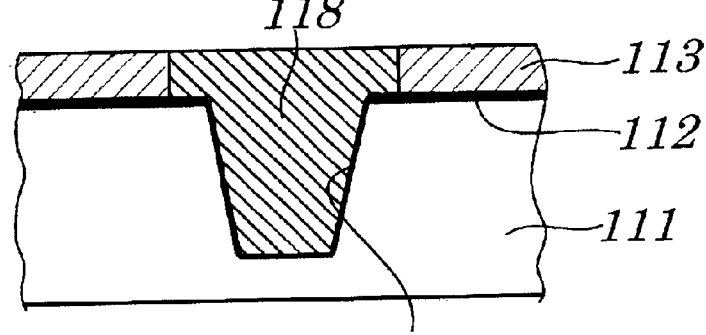
Figure 5G:
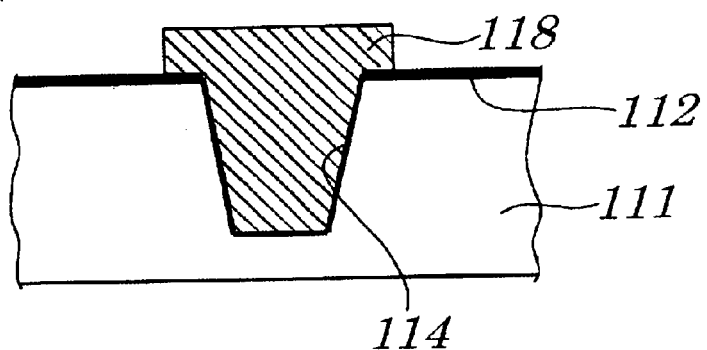
Figure 5H:
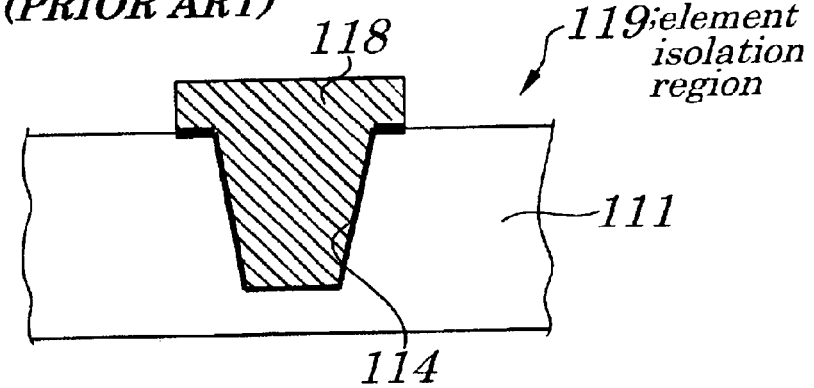
Figure 6A:
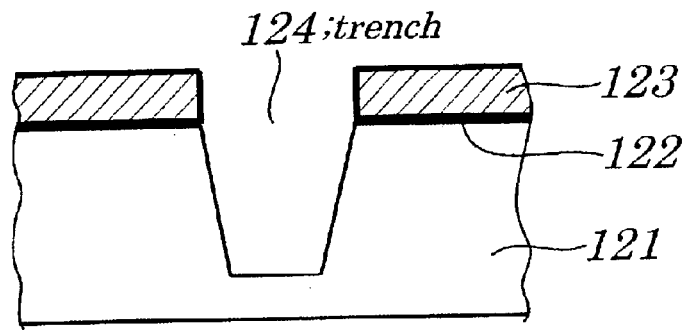
FIGS. 6A–6C are process diagrams showing in sequence still another conventional method for manufacturing a semiconductor device (a third conventional technology)
Figure 6B:
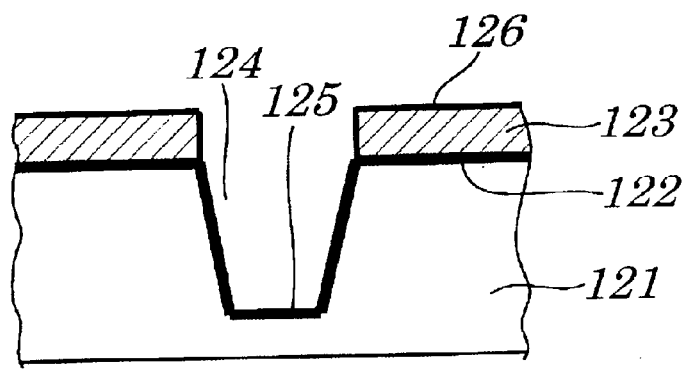
Figure 6C:
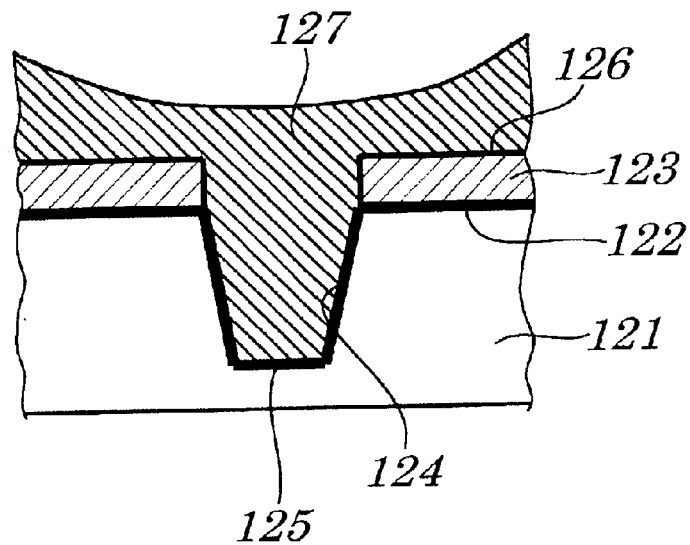
Figure 6D:
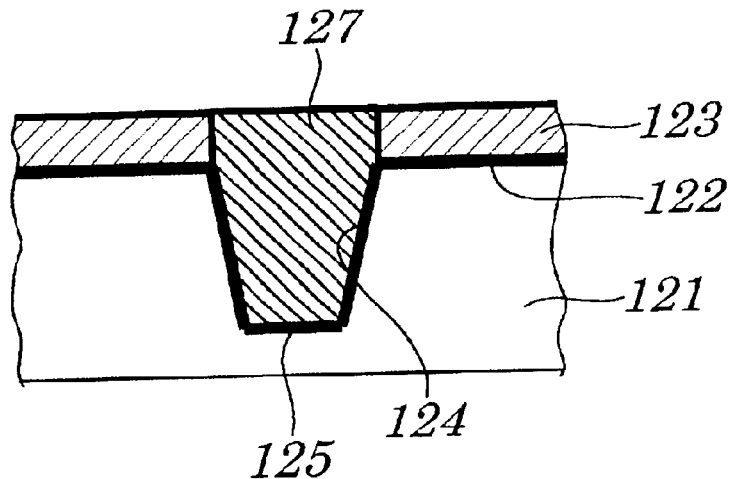
FIGS. 6D–6F are continued process diagrams for showing in sequence still the other conventional method for manufacturing the same semiconductor device (the third conventional technology)
Figure 6E:
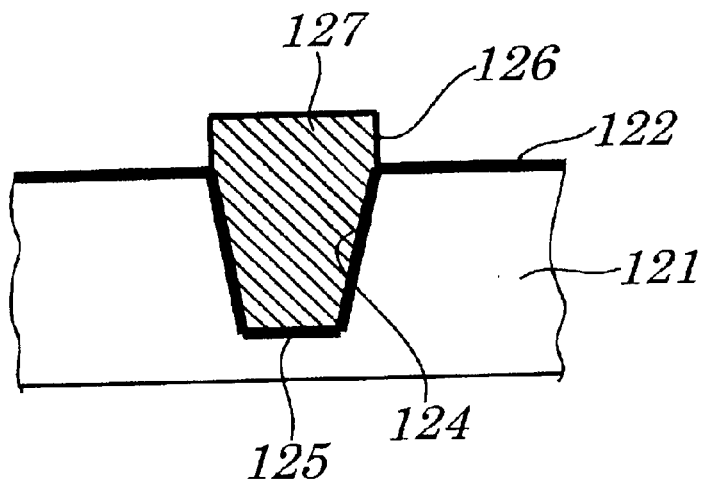
Figure 6F:
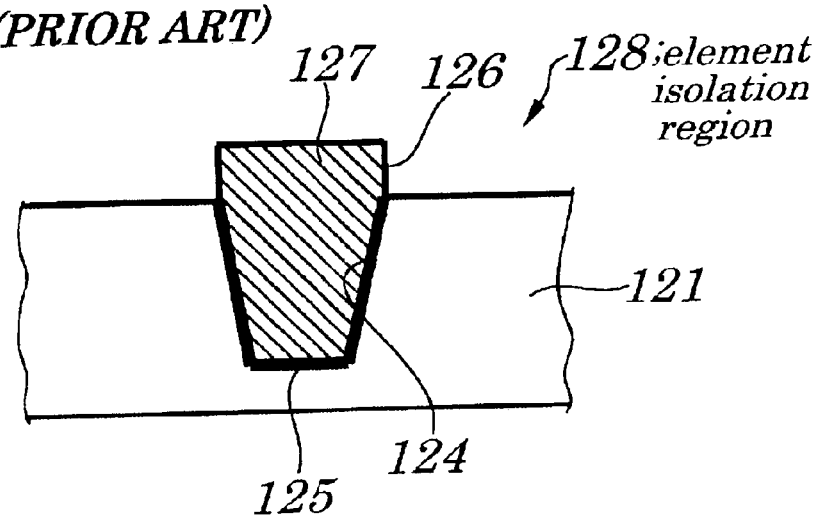
Figure 7:
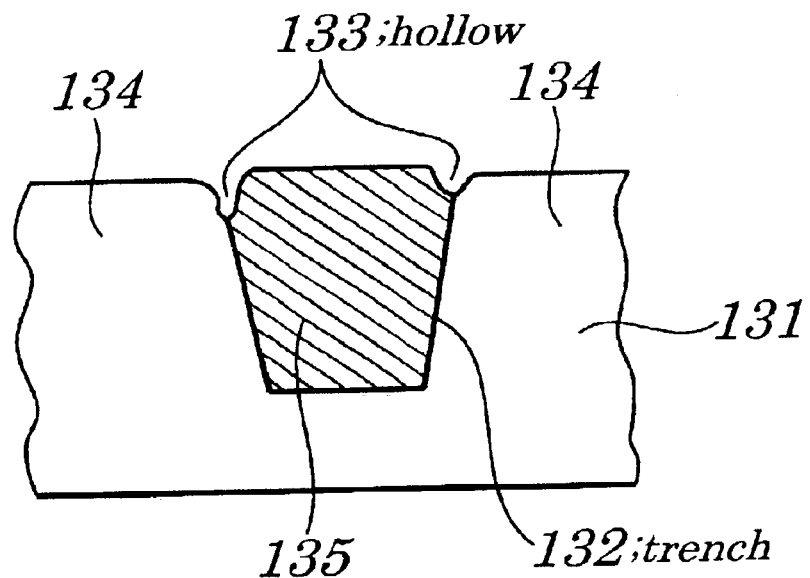
FIG. 7 is an illustration for outlining a disadvantage of the conventional semiconductor device manufacturing method.
Figure 8:
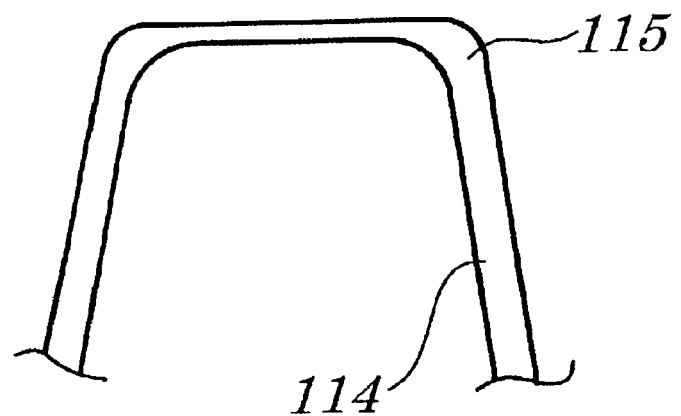
FIG. 8 is an illustration for outlining a disadvantage of the conventional semiconductor device manufacturing method.

Next, as shown in FIG. 1E, rounding oxidation by use of radical oxidation for rounding an edge of the trench 4 in the silicon substrate 1 is performed to form a silicon oxide film 7 having a film thickness of about 20 nm on the surface of the trench 4. That is, the silicon oxide film 5 having the thinner film in thickness (about 2 nm) already formed on the surface of the trench 4 is transformed into the silicon oxide film 7 having the greater film in thickness (about 20 nm). By thus utilizing radical oxidation, a conventional overhung rounded shape such as shown in FIG. 8 is improved, to mitigate irregularities in film thickness of the edge of the trench 4 in order to provide a constant film thickness as shown in FIG. 2. Since radical oxidation has a high degree of oxidation behavior, during this oxidation, the silicon nitride film 3 is also oxidized considerably on its surface simultaneously, to form a silicon oxide film 8 having a film thickness of 15–18 nm. However, pullback etching is already completed, so that the silicon oxide film 8, if any, has no adverse effects.

Figure 1F:
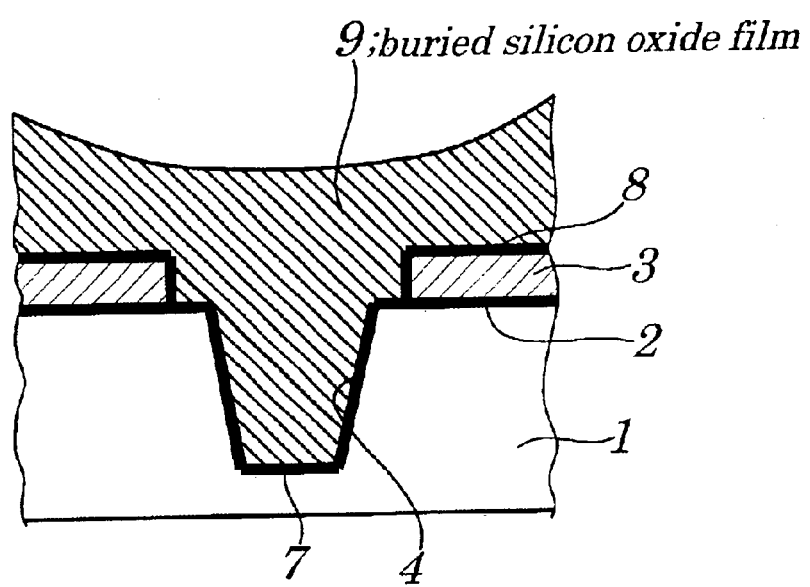

Next, as shown in FIG. 1F, a buried silicon oxide film 9 made of a silicon oxide film is formed by CVD throughout the surface. The buried silicon oxide film 9 is specifically buried in such a manner as to completely cover an inside surface of the trench 4 through the silicon oxide film 8 present on the surface of the silicon nitride film 3.

Figure 1G:
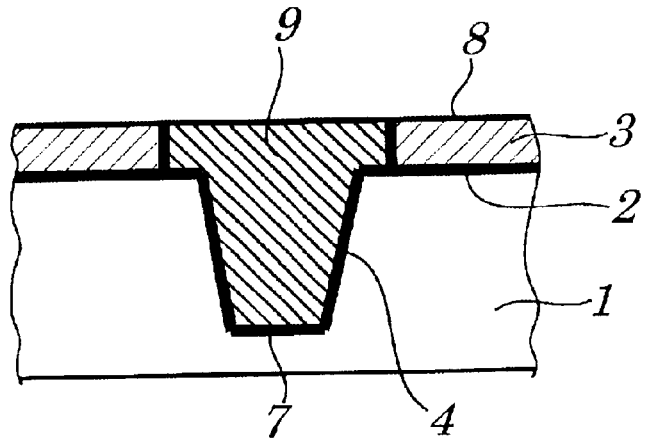
FIGS. 1G–1I are further continued process diagrams for showing in sequence the method for manufacturing the same semiconductor device.
Figure 1H:
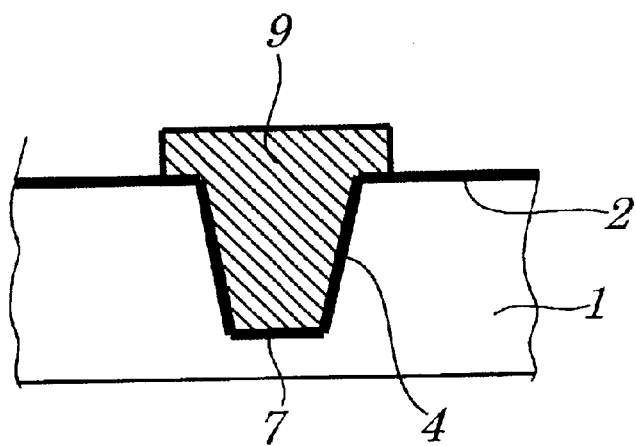
Figure 1I:
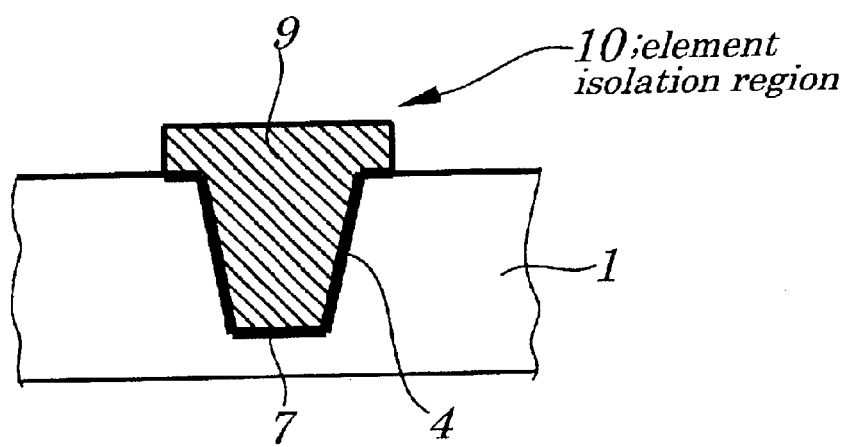

Next, as shown in FIG. 1G, the buried silicon oxide film 9 is polished by CMP (Chemical Mechanical Polishing) method so as to be thinner using the silicon nitride film 3 as a stopper layer. Subsequently, as shown in FIG. 1H, the silicon nitride film 3 is etched off using hot phosphoric acid. Next, as shown in FIG. 1I, the silicon oxide film 2 is selectively etched off to thereby form an element isolation region 10.

After the element isolation region 10 is formed, as in the case of an ordinary semiconductor device manufacturing method, desired elements such as MOS transistors (not shown) are formed in each of semiconductor regions (active regions) which are insulated and isolated from each other by the element isolation region 10, thereby completing an LSI (Large Scale Integration).

Thus, according to the semiconductor device manufacturing method of the present embodiment, by forming the trench 4 in the silicon substrate 1 on which the silicon oxide film 2 and the silicon nitride film 3 are stacked sequentially; then oxidizing the silicon substrate 1 using the oxidation method, hereby forming a silicon oxide film 5 only on the surface of the trench 4, without forming nearly at all a silicon oxide film on the surface of the silicon nitride film 3, after this pullback etching processing of the silicon nitride film 3 follows; and then performing rounding oxidation by use of radical oxidation to round the edge of the surface of the trench 4, it is possible to use the pullback etching proceeding and the radical oxidation method in combination with each other, thereby improving a degree of the buried silicon oxide film 9 being buried and also well forming a round shape of the edge of the trench 4.

Therefore, it is possible to perform pullback etching on the silicon nitride film 3 while performing rounding oxidation by use of radical oxidation.

It is apparent that the present invention is not limited to the above embodiments but may be changed and modified without departing from the scope and spirit of the invention. For example, although the dry oxidation method of forming the silicon oxide film only on the surface of the trench 4 without forming nearly at all the silicon oxide film on the surface of the silicon nitride film 3 has been exemplified as being conducted in an oxidizing atmosphere containing 100% oxygen, the present invention is not limited thereto; for example, it may be conducted in an oxidizing atmosphere in which oxygen is diluted by an inert gas such as nitrogen or argon. This approach is effective in adjusting a film formation rate of the silicon oxide film despite that in this case the film formation rate is decreased due to a decrease in concentration of oxygen in the atmosphere.

Further, the dry oxidation method of forming a silicon oxide film only on the surface of the trench 4 without forming nearly at all a silicon oxide film on the surface of the silicon nitride film 3 can provide almost the same effects under conditions of a temperature range of 600–750° C. and a film thickness range of 1–4 nm irrespective of the temperature conditions and the film thickness described in the embodiments. Further, although the embodiments have been described in an example where the buried silicon oxide film 9 is buried into the trench 4 to thus form the element isolation region 10, a silicon nitride film in place of the silicon oxide film or any other insulating material such as a silicon oxide film to which an impurity such as boron or phosphorus is added may be buried.

What is claimed is:

1. A method for manufacturing a semiconductor device comprising, burying an insulating material into a trench formed in a semiconductor substrate to thereby form an element isolation region in order to form a desired element in each of semiconductor regions which are insulated and isolated from each other by said element isolation region, said method comprising:

a trench formation step for sequentially forming and stacking an oxide film and a nitride film on said semiconductor substrate, to selectively etch off said nitride film and said oxide film which are present on a region in which said element isolation region is expected to be formed and then selectively etch off said semiconductor substrate using said nitride film as a mask, thus forming said trench;

a semiconductor substrate oxidation step for oxidizing said semiconductor substrate by a method of forming an oxide film only on a surface of said trench without forming nearly at all an oxide film on a surface of said nitride film;

a nitride film pullback step for performing pullback etching on said nitride film in such a manner that a width of an opening in said nitride film may be larger than a width of an opening of said trench;

a radical oxidation step for performing rounding oxidation by use of radical oxidation method to thus round an edge of the surface of said trench; and an insulating material burying step for burying said insulating material into said trench.

2. A method for manufacturing a semiconductor device comprising, burying an oxide into a trench formed in a silicon substrate to thereby form an element isolation region in order to form a desired element in each of semiconductor regions which are insulated and isolated from each other by said element isolation region, said method comprising:

a trench formation step for sequentially forming and stacking a silicon oxide film and a silicon nitride film on said silicon substrate, to selectively etch off said silicon nitride film and said silicon oxide film which are present on a region in which said element isolation region is expected to be formed and then selectively etch off said silicon substrate using said silicon nitride film as a mask, thus forming said trench;

a silicon substrate oxidation step for oxidizing said silicon substrate by an oxidation method of forming a silicon oxide film only on a surface of said trench without forming nearly at all the silicon oxide film on a surface of said silicon nitride film;

a silicon nitride film pullback step for performing pullback etching on said silicon nitride film in such a manner that a width of an opening in said silicon nitride film may be larger than a width of an opening of said trench;

a radical oxidation step for performing rounding oxidation by use of radical oxidation to thus round an edge of the surface of said trench; and an oxide burying step for burying said oxide into said trench.

3. The method for manufacturing the semiconductor device according to claim 2, wherein said silicon substrate oxidation step is performed by dry oxidation at 600–750° C., to form said silicon oxide film.

4. The method for manufacturing the semiconductor device according to claim 3, wherein said silicon oxide film is formed so as to have a film thickness of 1–4 nm.

5. The method for manufacturing the semiconductor device according to claim 3, wherein said dry oxidation method is performed in an oxidizing atmosphere containing an oxygen gas.

6. The method for manufacturing the semiconductor device according to claim 5, wherein said dry oxidation is performed in an oxidizing atmosphere in which said oxygen gas is diluted by an inert gas.

7. The method for manufacturing the semiconductor device according to claim 2, wherein said silicon substrate pullback step is performed using hot phosphoric acid.

8. A method for manufacturing a semiconductor device comprising, burying an oxide into a trench formed in a silicon substrate to thereby form an element isolation region in order to form a desired element in each of semiconductor regions which are insulated and isolated from each other by said element isolation region, said method comprising:

a trench formation step for sequentially forming and stacking a silicon oxide film and a silicon nitride film on said silicon substrate, to selectively etch off said silicon nitride film and said silicon oxide film which are present on a region in which said element isolation region is expected to be formed and then selectively etch off said silicon substrate using said silicon nitride film as a mask, thus forming said trench;

a silicon substrate oxidation step for oxidizing said silicon substrate by a dry oxidation method of forming a silicon oxide film only on a surface of said trench without forming nearly at all the silicon oxide film on a surface of said silicon nitride film;

a silicon nitride film pullback step for performing pullback etching on said silicon nitride film in such a manner that a width of an opening in said silicon nitride film may be larger than a width of an opening of said trench;

a radical oxidation step for performing rounding oxidation by use of radical oxidation to thus round an edge of the surface of said trench;

an oxide burying step for burying said oxide into said trench, and wherein said dry oxidation method is performed under conditions at 600–750° C. in an oxidizing atmosphere containing an oxygen gas.

9. A method for manufacturing a semiconductor device according to claim 8, wherein said dry oxidation method is performed under conditions at 600–750° C. in an oxidizing atmosphere of 100% oxygen gas.

* * * * *